United States Patent [19]

Nawata et al.

[11] 4,370,670
[45] Jan. 25, 1983

[54] TRANSISTOR WITH PLURAL PARALLEL UNITS

[75] Inventors: Yoshiaki Nawata; Yasutaka Nakatani, both of Yakohama; Haruki Nakazawa, Kawasaki, all of Japan

[73] Assignee: Fujitsu Limited, Kanagawa, Japan

[21] Appl. No.: 138,111

[22] Filed: Apr. 7, 1980

[30] Foreign Application Priority Data

Apr. 11, 1979 [JP] Japan ................................. 54-43967

[51] Int. Cl.³ .......................................... H01L 29/72
[52] U.S. Cl. ................................................. 357/36
[58] Field of Search ........................................ 357/36

[56] References Cited

U.S. PATENT DOCUMENTS

| | | | |
|---|---|---|---|
| 3,462,658 | 8/1969 | Worchel et al. | 357/36 |
| 3,489,964 | 1/1970 | Masuda | 357/36 |
| 3,665,266 | 5/1972 | Drozdowicz et al. | 357/36 |
| 3,667,008 | 5/1972 | Katnack | 357/36 |
| 3,740,621 | 6/1973 | Carley | 357/36 |
| 4,072,979 | 2/1978 | Palara | 357/36 |

Primary Examiner—R. A. Rosenberger
Attorney, Agent, or Firm—Staas & Halsey

[57] ABSTRACT

This invention discloses a structure of a transistor suitable for high frequency and high output power. An emitter region having a first conductivity type is formed in a base region having opposite conductivity type in contact with a collector region having the first conductivity type. Said emitter region is divided into a plurality of active emitter regions by a plurality of isolation regions having said opposite conductivity type which are formed in said emitter region and said active emitter regions are connected in parallel by an electrode such as for lead-out. The isolation regions may be used as stabilizing resistors and connected between each said active emitter region and the electrode.

24 Claims, 9 Drawing Figures

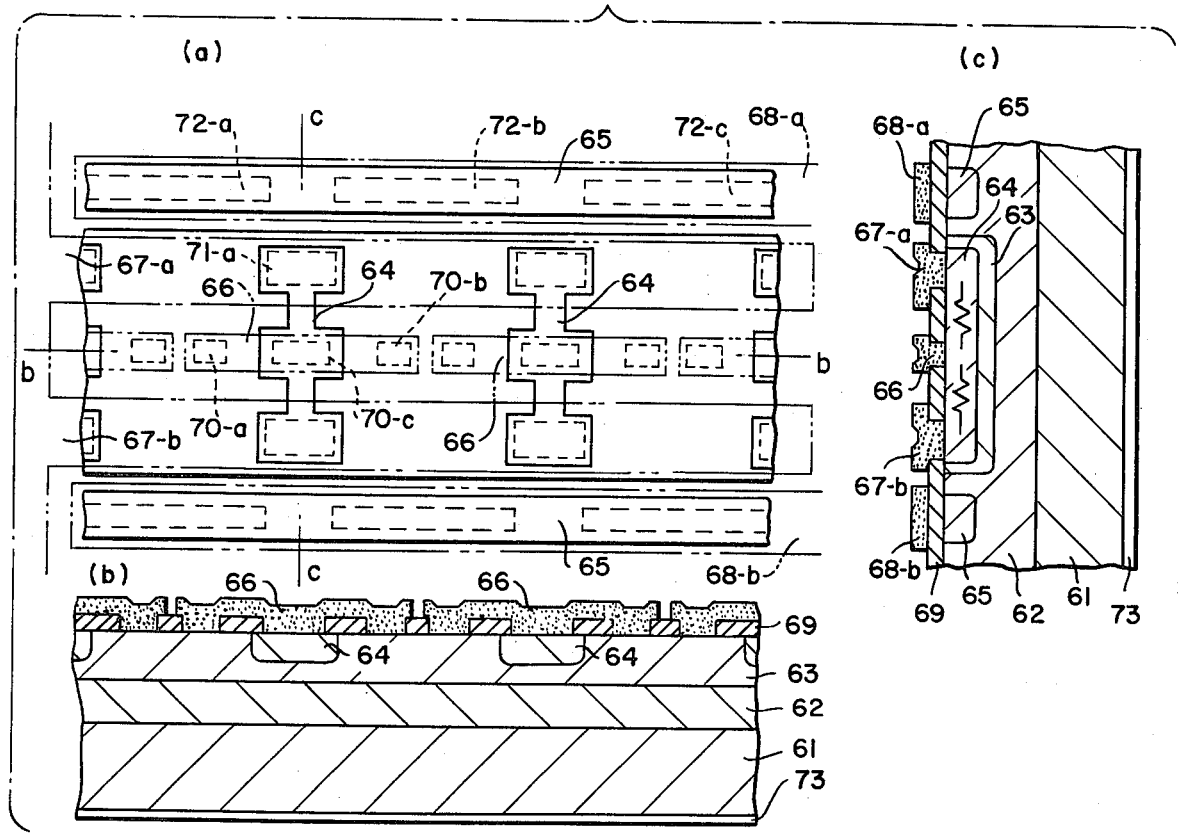
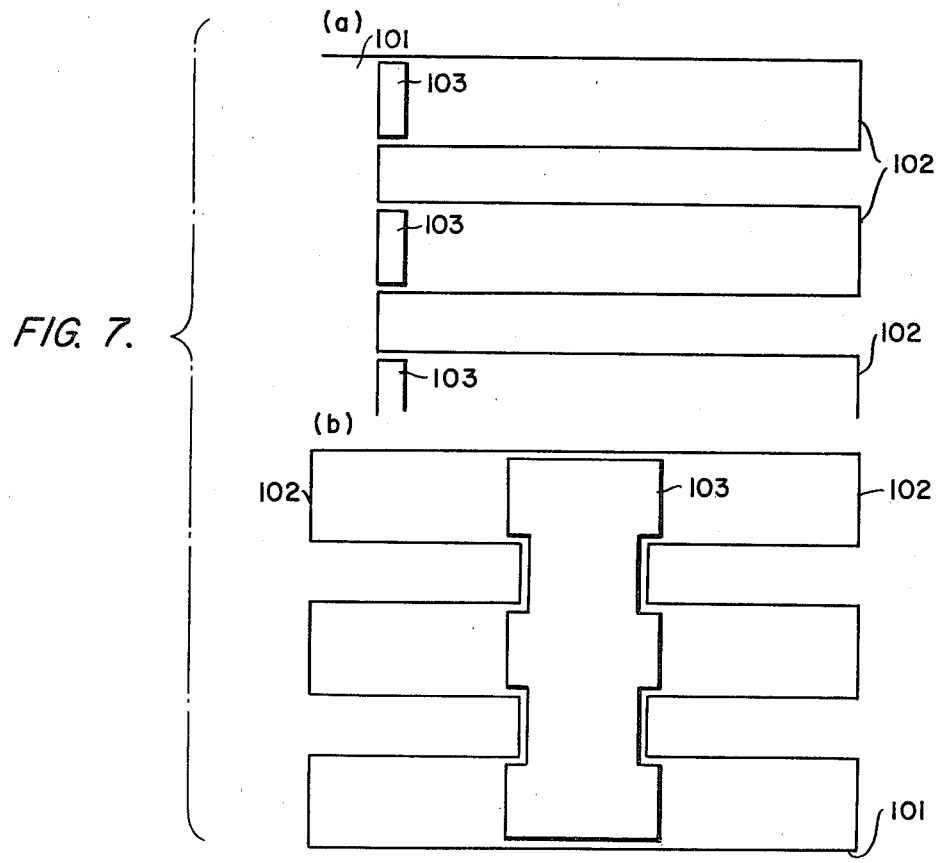

ND PARALLEL UNITS

TRANSISTOR WITH PLURAL PARALLEL UNITS

BACKGROUND OF THE INVENTION

1. Field of the Invention

This invention relates to a transistor, particularly to a structure of a high frequency and high output power transistor where a plurality of transistor units are connected in parallel.

2. Description of the Prior Art

As the existing high frequency and high output power transistor where a plurality of transistor units for low level signals on a semiconductor substrate are connected in parallel, the overlay type transistor (e.g. U.S. Pat. No. 3,434,091), the ring-emitter type transistor (e.g. U.S. Pat. No. 4,157,561) etc. have been developed and already put to practical use.

In these transistors, the base (lead out) electrode and the emitter (lead out) electrode which connect individual transistors formed in isolation from each other on an insulation film such as silicon dioxide ($SiO_2$) are formed on said semiconductor substrate and disposed in the form of the teeth of a comb on each transistor unit.

Therefore, if said insulation film has a pinhole or is partially missing, the base and emitter are likely shorted. When the width of said electrode or the number of electrodes increases in order to increase power, the probability of shorting is naturally increased.

Such short-circuiting of the base and emitter deteriorates the yield of manufacture and the reliability of the resultant transistor.

On the other hand, the individual transistor units formed on the semiconductor substrate which structures these transistors do not always have the same electric characteristics, and when said transistor operates, a particular transistor unit may suffer secondary breakdown due to an excessive load resulting from irregularity of the characteristics of each transistor unit. Therefore, a transistor of this type includes a stabilizing resistor in the emitter circuit of each transistor unit in order to equalize a load applied on the transistor units by utilizing a negative feedback effect by such stabilizing resistor.

Various means are already proposed for insetting said stabilizing resistor.

In one method proposed as the stabilizing resistor material, a metallic substance such as nichrome (Ni-Cr) etc. or a polycrystalline semiconductor substance such as polycrystalline silicon is used. Such resistor materials are deposited and laminated in the electrode window provided in the insulating film covering the emitter regions and the electrode wiring is connected to one end, or a resistor material is formed on said insulating film and connected at a central portion thereof to the electrode wiring through an electrode window provided on said insulating film covering the emitter regions.

In another method, a diffusion region with the same conductivity type as the emitter region is formed in the base region simultaneously with said emitter region or in a different process from that for said emitter region for use as a stabilizing resistor. Said diffusion resistor region is formed in such a way as to contact the emitter region at one end with the other end connected to the electrode wiring; or said diffusion resistor region is isolated by being formed at a distance from the corresponding emitter region so that one end is connected to the emitter region with the electrode wiring and the other end is let to the electrode wiring.

However such existing general methods have the disadvantages that manufacturing processes increase, desired electrical characteristics cannot be obtained and moreover high integration density cannot be obtained.

For example, in the case of a metallic substance or a polycrystalline semiconductor substance being used as a resistor material, the processes for depositing these materials and for forming them into the desired pattern inevitably add to the manufacturing process. In addition, such attempts to increase the number of emitters for obtaining higher output power makes patterning of the resistor material difficult, resulting in lower integration density and increasing the physical dimensions of a semiconductor element (chip size).

Moreover, there is difficulty in the selection of a material which simultaneously satisfies the ohmic value and current capacity.

In the case that said diffusion region, having an impurity of the same conductivity type as the emitter region, is diffused into the base region to be used as a stabilizing resistor, carrier injection occurs from said diffusion resistance region to the base region during operation of a transistor and thereby the current amplification factor ($h_{FE}$) of said transistor is reduced. Further, an attempt to form the emitter region and said diffused resistor region in different diffusion processes will naturally cause an increase in the number of manufacturing steps.

SUMMARY OF THE INVENTION

This invention offers a transistor without the disadvantages of a transistor of the known structures and which can be realized with sufficiently high manufacturing yield.

Moreover, this invention offers a transistor which can assure an excellent high frequency characteristic and a high output power characteristic.

In order to attain such purposes, this invention offers a transistor comprising the emitter region having a first conductivity type formed in the base region having the opposite conductivity type in contact with the collector region having the first conductivity type. Said emitter region is divided into plurality of active emitter regions by a plurality of divider regions having opposite conductivity type which are formed in said emitter region and said active emitter regions are connected in parallel by an electrode such as a lead-out electrode. A plurality of stabilizing resistor regions composed of regions having the opposite conductivity type, or made of other resistor material, are inserted and connected between each active emitter region and an electrode, such as a lead-out electrode.

BRIEF DESCRIPTION OF THE DRAWINGS

FIGS. 1a, 1b and 1c illustrate the structure of a transistor in accordance with a first embodiment of the present invention, FIG. 1b being a cross-sectional view taken along the line B—B of FIG. 1a, and FIG. 1c being a cross-sectional view taken along the line C—C of FIG. 1a;

FIG. 6 illustrates the structure of a transistor in accordance with a sixth embodiment of the present invention, FIG. 6b being a cross-sectional view taken along the line B—B of FIG. 6a, and FIG. 6c being a cross-sectional view taken along the line C—C of FIG. 6a;

FIG. 7 illustrates the structure of a transistor in accordance with a seventh embodiment of the present invention;

FIG. 8 illustrates the structure of a transistor in accordance with an eighth embodiment of the present invention, FIG. 8b being a cross-sectional view taken along the line B—B of FIG. 8a;

DETAILED DESCRIPTION OF THE PREFERRED EMBODIMENTS

Figure 1:
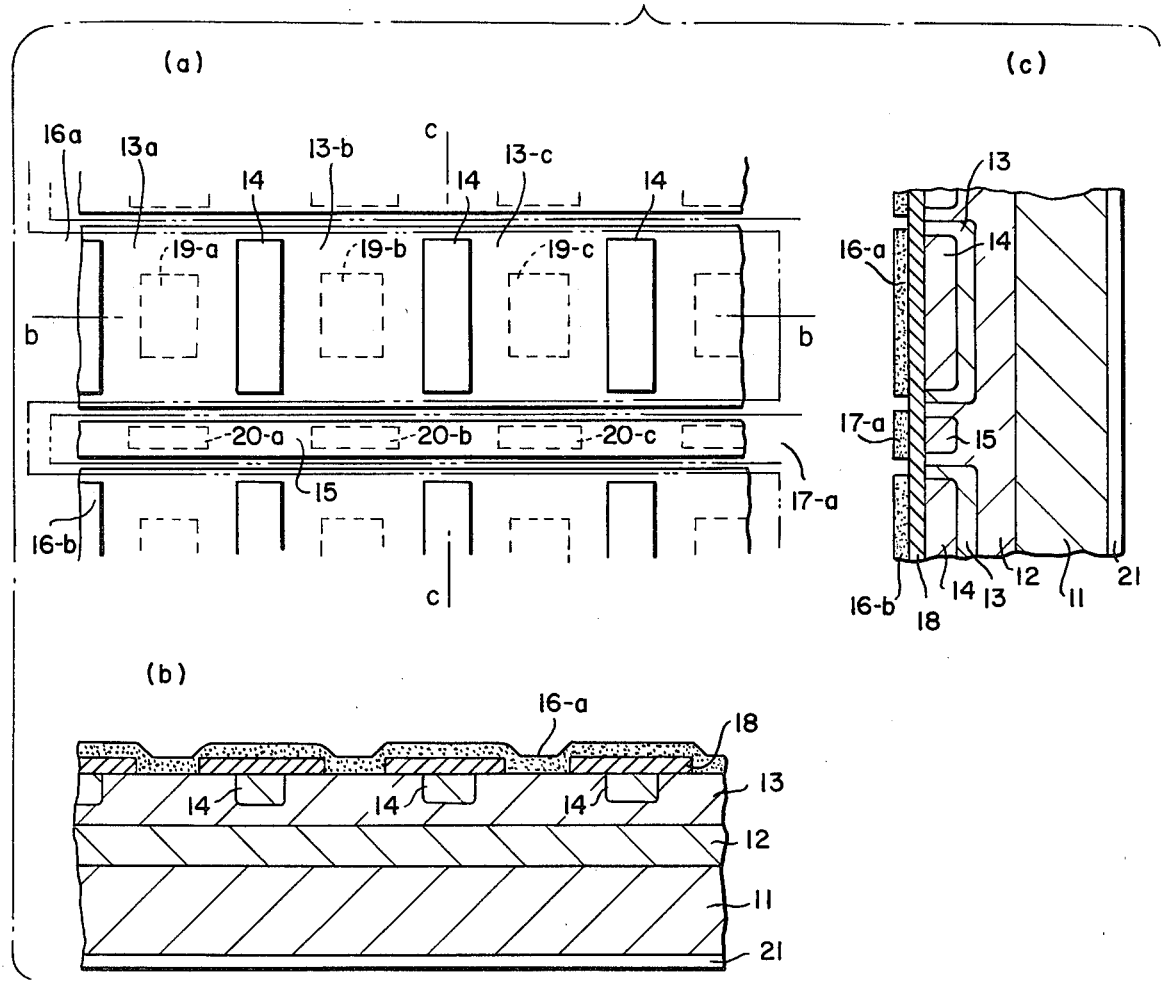

FIGS. 1a, 1b and 1c show a first embodiment of a transistor of this invention. FIG. 1b is the section along the line B—B of FIG. 1a, while FIG. 1c is the section along the line C—C of FIG. 1a. These figures show a collector region 11 having a structure, for example, of an N type epitaxial layer formed on an N+ type semiconductor substrate such as an N+ type silicon (Si) substrate; a P type base region 12 formed on the surface of said collector region 11; an N+ type emitter region 13 having a stripe configuration (as in the form of the teeth of a comb) formed in said base region 12; a plurality of P+ type isolation regions 14 formed in said emitter region 13; and a P+ type base contact region 15. The base contact region 15 is formed to extend in the base region 12 along said striped emitter region 13.

In addition, emitter lead-out electrodes 16-a and 16-b extend along each said emitter region stripe 13, and a base lead-out electrode 17a extends on the base contact region 15.

Moreover, an insulating film 18 covers the semiconductor substrate surface; emitter lead-out electrode connecting windows 19-a, 19-b and 19-c are formed on said insulating film 18; base lead-out electrode connecting windows 20-a, 20-b and 20-c are formed on said insulating film 18 along with the collector electrode 21.

A transistor of this invention has the feature that a striped emitter region 13 is separated or divided into several small emitter regions or active emitter regions 13-a, 13-b, . . . by the isolation or divider regions 14 which are shown selectively disposed in the direction orthogonal to the direction of said emitter stripe. The small emitter regions may be shaped rectangularly. Said isolation regions 14 do not isolate said striped emitter region 13 into small emitter regions by coming into contact with the base region 12 by completely crossing the striped emitter region 13 or by extending the entire depth of the emitter region 13. But said isolation regions 14 are disposed in said striped emitter region 13 in the form of islands and the cross section of the emitter region is reduced at the sides and below said isolation region 14. Thus said striped emitter region 13 is isolated into small emitter regions 13a, 13b, . . . due to the resistance of the reduced cross section.

Each isolated small emitter region 13a, 13b, . . . operates at a respective portion of the emitter-base junction area near to the adjacent base contact region 15. Each small emitter region, the portion of the base region which contacts it and the collector region under said portion of the base region forms a transistor unit.

Therefore, a single striped emitter region 13 is structured by a plurality of small emitter regions which are connected in parallel with the emitter lead-out electrode. Moreover, when the plurality of said striped emitter regions are connected in parallel, a transistor of this invention can have a structure suited for high frequency and high output power.

In such a structure, the emitter lead-out electrodes 16 which extend on each striped emitter region 13 and which connect in parallel the small emitter regions via the lead-out electrode connecting windows 19-a . . . are used for connecting in parallel said small emitter regions without being disposed on the base region. Therefore, even if pinholes exist on the insulating film 18 and if as a result of the pinholes the emitter lead-out electrodes 16 are connected to some of the isolation regions 14, the shorting as a result of the pinholes is limited to that between these isolation regions and the adjacent small emitter regions and does not extend to the entire emitter region 13 and base region 12 since these isolation regions 14 are isolated from the base region 12 by the emitter region 12 in an electrically floating condition. Thus, there is no reduction in manufacturing yield and reliability due to pinholes of the insulating film under said emitter lead-out electrode.

Moreover, the emitter lead-out electrode can be formed with width almost as large as the width of each single stripe emitter region 13, realizing an increase of the effective cross section of the lead-out electrode, which structure is very effective for obtaining a high output power by increasing the number of transistor units formed in said stripe emitter region.

Since said isolation regions 14 are formed simultaneously with the stabilizing resistor regions and/or the base contact regions 15 by a diffusion method as will be explained later, the manufacturing steps are not increased.

Figure 2:
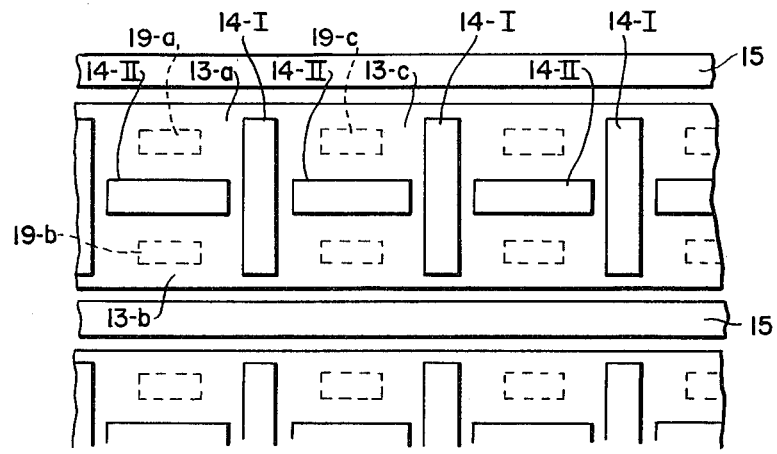
FIG. 2 illustrates the structure of a transistor in accordance with a second embodiment of the present invention.
Figure 3:
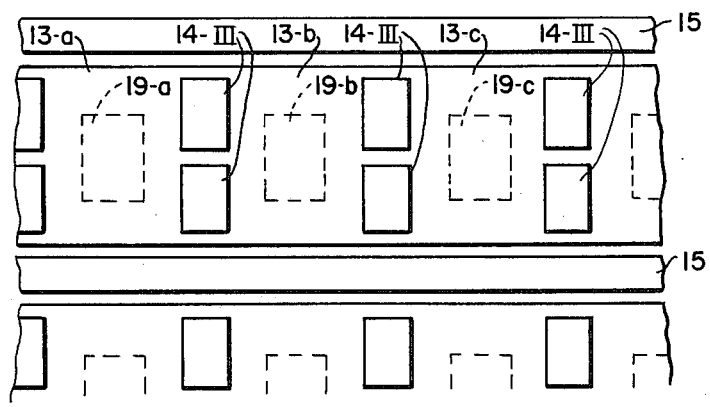
FIG. 3 illustrates the structure of a transistor in accordance with a third embodiment of the present invention.

FIGS. 2 and 3 show additional isolated regions disposed within the striped emitter region 13 in the transistor structure of FIG. 1.

In the embodiment of FIG. 2, the striped emitter region 13 is divided into a plurality of small emitter regions 13-a, 13-b, . . . by the isolation regions 14-I extending in the direction orthogonal to the stripe direction and by the isolation regions 14-II extending in the direction parallel to said stripe direction. The small emitter regions 13a, 13b, . . . are shaped rectangularly. Each of the isolated small emitter regions is connected to the emitter lead-out electrode through the connecting windows 19-a, 19-b, . . . in the insulating film 18 (FIGS. 1b, 1c) covering the surface. The region 15 is the P+ type base contact region as is already explained.

In the embodiment of FIG. 3, the stripe emitter region 13 is divided into a plurality of small emitter regions 13-a, 13-b, . . . by at least two isolation regions 14-III which are aligned in the direction orthogonal to said stripe direction. Each of the isolated small emitter regions is connected to the emitter lead-out electrode by the connecting windows 19-a, 19-b, . . . in the insulating film 18 covering the surface of it.

In this structure, the small emitter regions 13a, 13b, . . . in the striped emitter region 13 are mutually isolated at the sides and below the isolation region 14-III.

The region 15 is the P+ type base contact region.

Figure 4:
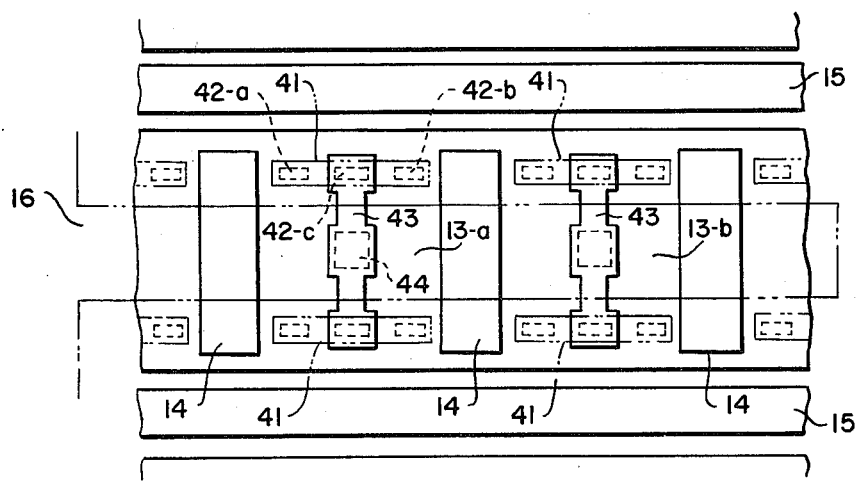
FIG. 4 illustrates the structure of a transistor in accordance with a fourth embodiment of the present invention.
Figure 5:
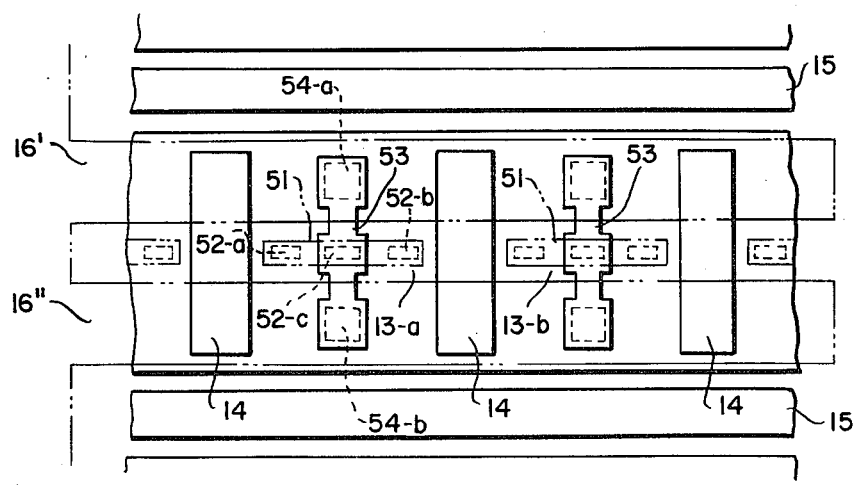
FIG. 5 illustrates the structure of a transistor in accordance with a fifth embodiment of the present invention.

FIGS. 4 and 5 involve the structures of a transistor of the present invention as shown in FIG. 1 to FIG. 3, where a stabilizing resistor is inserted in each of the small emitter regions formed in the striped emitter region under the emitter lead-out electrode. In FIGS. 4 and 5, the structure where the isolation regions are inserted will be explained with the structure shown in FIG. 1 mentioned above.

First of all, in the embodiment shown in FIG. 4, the emitter leadout electrodes 16 are disposed on the center line of the striped emitter region 13 and extend in the direction of the stripe, and metallic wiring or electrode layers 41 are disposed in parallel to said emitter lead-out electrode 16 on both sides of said emitter lead-out electrode 16 and extend over the small emitter regions. Said metallic wiring layers 41 are connected to the small emitter regions (for example, 13-a) via the connecting windows 42-a, 42-b in the insulating film 18 (FIGS. 1b, 1c), while said metallic wiring layers 41 and emitter lead-out electrodes 16 are mutually connected, for example, via the P+ type (namely, of opposite conductivity to that of the emitter region) stabilizing resistor region 43. Said stabilizing resistor region 43 and the emitter lead-out electrode 16 are connected via the connecting window 44, while said stabilizing resistor region 43 and the metallic wiring layer 41 are connected via the connecting window 42-c. In this structure, since an emitter current flows through the stabilizing resistor to the emitter lead-out electrode from both ends of each of the two metallic wiring layers 41, at least the emitter-base junction areas near the base contact region 15 of a small emitter region operates with essentially equal characteristics.

In the case that said stabilizing resistor is formed by injection of impurities having a conductivity type opposite to that of the emitter region, as mentioned above, in the structure wherein the stabilizing resistor is inserted between the emitter lead-out electrode 16 and each small emitter region, application of such structure as shown in FIG. 4 to the small emitter regions having the structure shown in FIG. 2 is difficult due to the existence of the isolation regions 14-II.

Therefore, for the structure shown in FIG. 2 a stabilizing resistor of, for example, a polycrystalline semiconductor layer or a metallic layer of nichrome, etc., may be inserted between said emitter lead-out electrode 16 and the metallic wiring layer 41 in order to connect them in the form of a bridge on the insulating film where the emitter lead-out electrode and metallic wiring layer are disposed.

In addition in the structure shown in FIG. 1 and FIG. 3, the stabilizing resistor can be obtained, of course, from said polycrystalline semiconductor layer or metallic layer.

In the embodiment shown in FIG. 5, the metallic wiring (or electrode) layers 51 are disposed on the small emitter regions on the center line in the direction of the stripe of the striped emitter region 13, and a pair of emitter lead-out electrodes 16′, 16″ are disposed in the stripe direction on both sides of said metallic wiring layers 51. Said metallic wiring layers 51 are connected to the small emitter regions (13-a, for example) via the connecting windows 52-a, 52-b provided in the insulating film while said metallic wiring layers 51 and emitter lead-out electrodes 16′, 16″ are mutually connected by the P+ type stabilizing resistor regions 53 as shown in the figure. Said stabilizing resistor regions 53 and the emitter lead-out electrodes 16′, 16″ are connected via the connecting windows 54-a, 54-b, while said stabilizing resistor regions 53 and the metallic wiring layers 51 are connected via the connecting window 52-c. In such structure, since an emitter current flows to the stabilizing resistor and emitter lead-out electrodes 16′, 16″ from both ends of the metallic wiring layers 51 disposed almost at the center line of the small emitter regions, at least the emitter-base junction areas near the base contact region 15 in each small emitter region operate with essentially equal characteristics. Since there are two connections of said emitter lead-out electrodes to each small emitter region this results in an increase of the effective cross section area of the emitter current carrying components. Therefore, this structure is very effective for obtaining a higher output power by connecting in parallel the plurality of said small emitter regions.

Also in the embodiment shown in FIG. 5, the stabilizing resistor can be composed of a polycrystalline semiconductor layer or a metallic layer of nichrome as is explained previously.

In the embodiment shown in FIG. 5, one of the two emitter lead-out electrodes 16′, 16″ and the portion of the stabilizing resistor connector thereto may be omitted in a design of a small capacity of the current that flows through the small emitter regions.

As is explained in detail using the embodiments, according to this invention, a transistor which can process a high frequency signal and a higher output power can be structured by separating the striped emitter region into small emitter regions by disposition of the regions having an opposite conductivity type into said emitter region and by connecting said small emitter regions in parallel directly or via the stabilizing resistors using the emitter lead-out electrodes disposed on said stripe emitter region. In the case of such a structure, at least the emitter lead-out electrodes connect in parallel the small emitter regions disposed and isolated on the stripe emitter region. In this case, since the isolation regions are put in the floating condition in the emitter region, shorts between the emitter and base do not occur even when pinholes exist in the insulating film, thus not resulting in a decline of manufacturing yield and deterioration of reliability.

FIGS. 6a, 6b and 6c show another embodiment of a transistor of this invention. In these figures, 6b shows the cross section along the line B—B of 6a, while 6c shows the cross section along the line C—C of 6a.

These figures show the collector region 61 comprising an N type epitaxial layer formed, for example, on the N+ type semiconductor substrate such as a silicon substrate; the P type base region 62 formed on the surface of said collector region 61; the N+ type emitter region 63 formed within said base region 62; the P+ type stabilizing resistor regions 64 formed within said emitter region 63; and the P+ type base contact region 65. The base contact region 65 extends in the base region 62 along said striped emitter region 63.

Also shown is the metallic wiring (or electrode) layer 66 which connects said stabilizing resistor region 64 and each small emitter of the emitter region 63; the emitter lead-out electrodes 67-a, 67-b; and the base lead-out electrodes 68-a and 68-b.

Moreover, the insulating film 69 covers the semiconductor substrate surface; windows 70-a, 70-b and 70-c are formed in said insulating film 69 for connecting the metallic electrode layer 66 to the stabilizing resistor region 64 and to each small emitter region; emitter lead-out electrode windows 71-a, 71-b are formed on said insulating film 69; base lead-out electrode connecting windows 72-a, 72-b are formed in said insulating film 69; and the collector electrode is also shown.

A transistor having a structure of this embodiment is characterized in that a single striped emitter region 63 is divided into a plurality of small emitter regions or active emitter regions 63-a, 63-b, . . . by the P+ type regions 64 which are disposed therein to extend in the direction orthogonal to the stripe direction, and which serve as the stabilizing resistors. Namely, in this embodiment, the isolation regions and stabilizing resistor regions which have been provided separately in said embodiment are integrated and the striped emitter region 63 is isolated into several small emitter regions by means of the stabilizing resistor region 64.

Therefore, said stabilizing resistor regions 64 are disposed in the form of islands in said striped emitter region 63 and the cross section of the emitter region is reduced at the side or below said stabilizing resistor region 64, and thereby said striped emitter region 63 is isolated into small emitter regions due to an increase of the resistance as a result of the reduced cross-section.

The isolated emitter regions respectively operate at the respective portions of the emitter-base junction areas between each small emitter and the adjacent base contact region 65.

Thus, a striped emitter region 63 is composed of a plurality of small emitter regions connected in parallel by the emitter lead-out electrode, and a transistor of this embodiment has a structure suited for a high frequency signal and higher output power as in the case of the above when the striped emitter regions are connected in parallel.

In the case of this structure, the emitter lead-out electrodes 67-a and 67-b connect in parallel said small emitter regions without being disposed on the base region, and may be formed at the same time of forming the parallel connection of the small emitter regions.

At this time, therefore, even if the emitter lead-out electrodes 67-a, 67-b are connected to the stabilizing resistor region 64 due to existence of pinholes on the insulating film, any short is limited only to that between said stabilizing resistor region 64 and the adjacent small emitter regions and is not extended to between the entire emitter region 63 and base region 62 since said stabilizing resistor region 64 is isolated in a floating condition from the base region by the emitter region. For this reason, there is no decline of manufacturing yield and deterioration of reliability due to the pinholes etc. on the insulating film just under said emitter lead-out electrode. Said stabilizing resistor region 64 can be formed by diffusion simultaneously with the base contact region, so that the manufacturing steps are not increased. In addition, in the case of the structure of the embodiment of FIG. 6, the stabilizing resistor regions also work as the isolation regions, and therefore the integration density of the transistor unit can be raised at least as compared with the structure of the embodiments shown in FIG. 4 and FIG. 5.

In the embodiment of FIGS. 6a, 6b and 6c, the metallic electrode layers 66 and emitter lead-out electrodes 67-a, 67-b may be formed as illustrated in FIG. 4. That is, emitter lead-out electrodes 67 may be disposed on the center line of the emitter stripe in the direction of the stripe, with the metallic electrode layers 66 disposed in parallel to and at the side of said emitter lead-out electrodes 67.

In the above-mentioned embodiments of this invention, the small emitter regions defined in the striped emitter region by selectively disposing the isolation regions and/or stabilizing resistor regions, but this invention can also be applied to the following structure.

In the case of a transistor having the structure where a plurality of striped emitter regions are connected in parallel electrically, one end of each said striped emitter regions is integrated by a common connection region having the same conductivity type as that of said striped emitter regions, and bonding pads are often disposed on such a common connection region.

Such a process is employed in order to prevent a short between the emitter electrodes and the base region under said insulating film over said common connection due to existence of pinholes on the insulating film located under the bonding pads or a crack generated at the time of connecting the lead wires to the bonding pads.

However, the area of the common connection region under the abovementioned bonding pad results in a parasitic transistor and also in deterioration of the breakdown voltage of the transistor.

Thus, as shown in FIG. 7a, when the isolation region 103 having a conductivity type opposite to that of said emitter region is disposed at least in the area of the common connection region 101 under the bonding pad at the point where each striped emitter region 102 is integrated thereto, then each striped emitter region 102 operates independently, and the region 101 under the bonding pad becomes inactive electrically, thus suppressing and preventing parasitic transistor operation.

Moreover, as shown in FIG. 7b, when the isolation region 103 having opposite conductivity type is formed for almost the entire area of the common connection region 101, that is, the area near the connect area of the region 101 and striped emitter region, generation of the parasitic transistor and shorting due to pinholes and cracks existing on said insulating film between the emitter electrode and base region can be prevented more reliably when the bonding pad is formed on said region 101 via said insulating film.

Disposition of the isolation regions in the common connection region under the bonding pad and at the ends of the stripe emitter regions of course can be adapted to the embodiments of this invention shown in FIG. 1a to FIG. 6c.

In addition, in another embodiment of this invention, the abovementioned stabilizing resistor region can be adopted as the isolation region which isolates said striped emitter region and the region under the bonding pad which connects in parallel the plurality of such emitter regions. Such a structure allows simultaneously the separation of each striped emitter region and insertion of the stabilizing resistor region.

Figure 8:
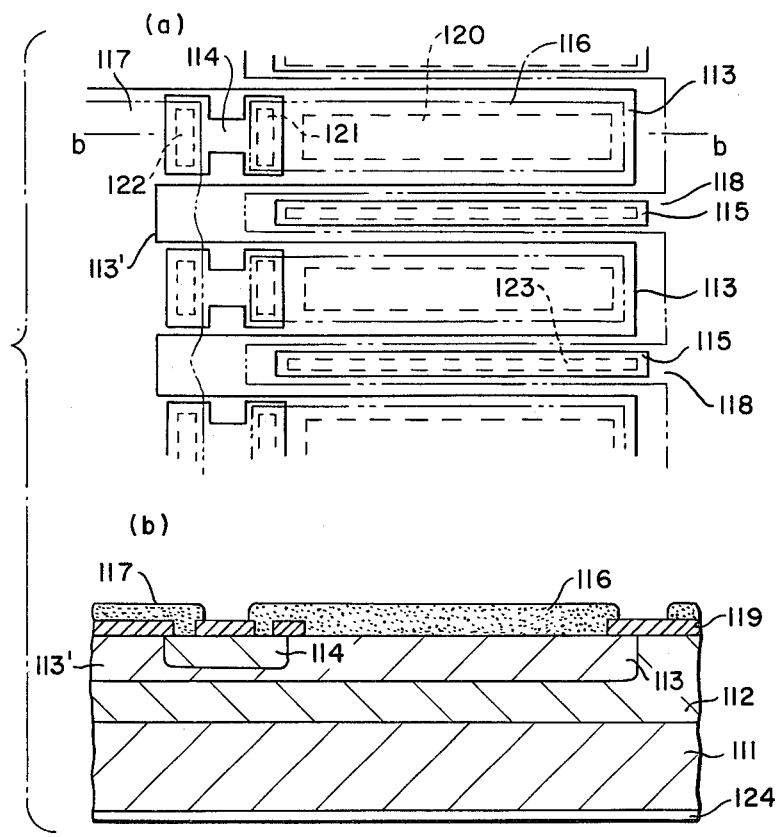

FIGS. 8a and 8b show a structure of such a transistor, with FIG. 8b showing the cross-section along the line B—B of FIG. 8a. These show the collector region 111 formed of an N type epitaxial layer, for example, with an N+ type semiconductor substrate, the P type base region 112 formed on said collector region; the N+ type striped emitter region 113 formed in said base region 112; the region 113' under the N+ type bonding pad which commonly connects in parallel said emitter regions 113; the P+ type stabilizing resistor region 114; the P+ type base contact region 115; the emitter electrode 116; the emitter lead-out electrode 117 forming the bonding pad; the base lead-out electrode 118; the insulating film 119 covering said semiconductor substrate surface; the emitter electrode connecting window 120 formed in said insulating film 119; the connecting window 121 for connection of the emitter electrode 116 to the stabilizing resistor region 114 formed in said insulating film 119; the emitter lead-out electrode connecting window 122 formed in said insulating film 119 in the same way; and the base lead-out electrode connecting window 123 is formed in said insulating film 119; and the collector electrode 124.

In such a structure, the striped emitter region 113 is connected to the emitter lead-out electrode via the stabilizing resistor and is isolated from the region 113' under the bonding pad.

Therefore, in the relevant transistor, the striped emitter region 113 can operate individually without causing concentration of a current, and the region 113' under the bonding pad becomes inactive electrically. Thereby, the relevant transistor can operate without resulting in deterioration of the current amplification factor.

Figure 9:
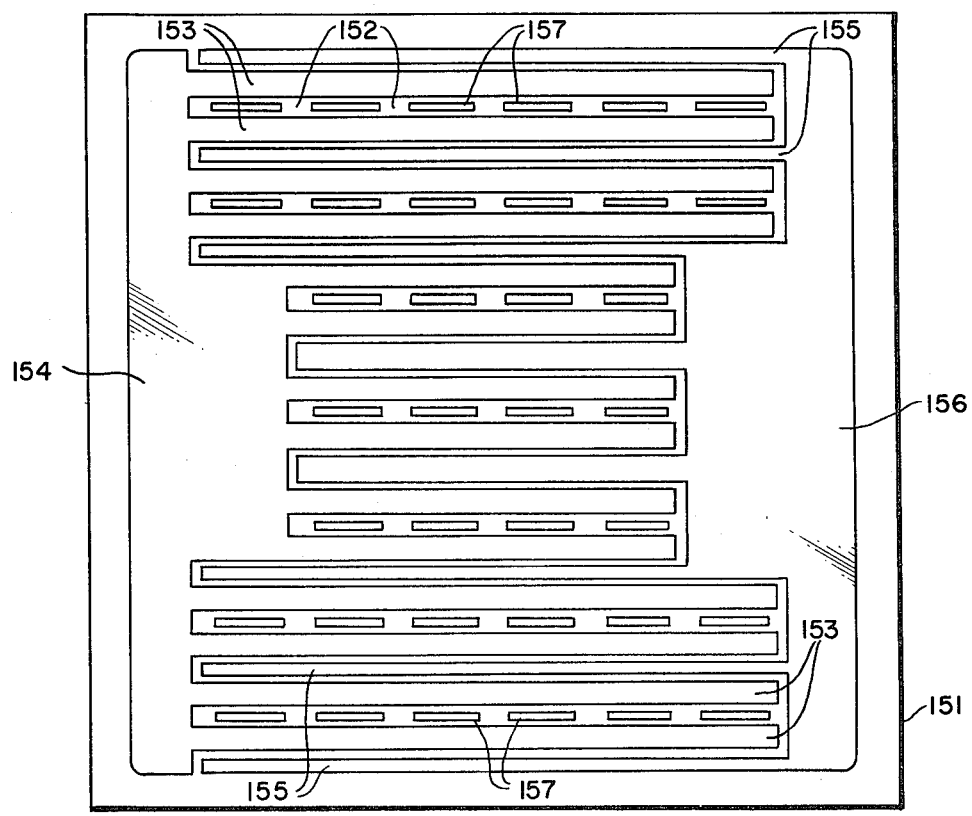
FIG. 9 is plan view of a transistor chip in accordance with the present invention.

FIG. 9 is a plan view of the transistor accommodating the transistor units indicated in FIG. 6, showing a transistor chip 151; transistor units 152; the emitter lead-out electrode 153; the emitter electrode terminal pad 154; the base lead-out electrode 155; the base electrode terminal pad 156; and the metallic wiring (or electrode) layer 157.

Here, illustration of said stabilizing resistor region is omitted.

In the above embodiment, the base contact region is indicated as a long rectangular shape disposed along the full length of the striped emitter region. But, of course, it could be shown in the shape of an island and the base lead-out electrode connecting window could also be shown along the full length of said based contact region.

The following means can be employed in order to form a transistor having the structure with such transistor units.

Namely, the collector region obtained by formation of the N type layer on the N+ type semiconductor substrate can be formed by epitaxial growth of the N type layer on the N+ type semiconductor substrate by the ordinary method, or by a process in which a donor impurity such as phosphorus (P) of high concentration is injected from both sides of the N type semiconductor substrate in order to form the N+ type layer after which the N+ type layer on the back side is removed.

Moreover, the P type base region can be formed by the ordinary complete diffusion method or a selective diffusion method of an acceptor impurity such as boron (B) etc. In this case, if the transistor is used for a high voltage, it should have the so-called mesa structure where the base-collector (BC) junction appears at the side of a semiconductor chip, and if used for a comparatively low voltage it should have the so-called planar structure where said BC junction terminates at the surface of the collector region.

The base contact region can be formed by injecting selectively the acceptor impurity as in the case of the base region with a concentration higher than by diffusion.

Moreover, the N+ type emitter region can be formed by selectively injecting the donor impurity such as arsenic (As), phosphorus (P) etc. in a high concentration into said base region by a diffusion method.

On the other hand, the P+ type isolation regions and P+ type stabilizing resistor regions can be formed by selectively injecting the acceptor impurity in a high concentration into said emitter region by diffusion. At this time, since the diffusion depth of said base contact regions is not strictly specified, said base contact region can be formed simultaneously with the diffusion of said isolation regions and/or the stabilizing resistor regions which are specified by the diffusion depth.

Meanwhile, for the surface insulating film, the silicon dioxide ($SiO_2$) which is formed by a thermal oxidation method or gas phase growth method can be used, and moreover it is also possible to employ silicon nitride ($Si_3N_4$) or phosphosilicate glass (PSG).

Moreover, the emitter lead-out electrode, base lead-out electrode and metallic electrode layers can be formed, for example, by vacuum evaporation of aluminum (Al) and photo etching, and electrical connection to said regions can be done via the electrode windows which are formed by photo etching said insulating film.

In the abovementioned transistor manufacturing processes, if the emitter region is shallow at the time of forming the isolation regions and stabilizing resistor regions in said emitter region, said emitter region may be changed to an undesirable depth due to the so-called "emitter-dip" effect. Thereby, the emitter-base breakdown voltage and emitter-collector breakdown voltage are lowered, and in addition it becomes difficult to obtain a sufficient current amplification factor in some cases. In order to reduce the influence of such "emitter-dip" effect, the following measures can be taken.

(1) The base region just under the isolation region and the stabilizing resistor region forming area is first formed selectively and deeply, so that sufficient base width (depth) after the emitter region is pushed out can be preserved.

(2) The emitter region where the isolation region and the stabilizing resistor region are to be formed is first formed shallowly with a low impurity concentration, so that the "emitter-dip" level at the time of forming the isolation region and stabilizing resistor region is cancelled and compensated.

(3) After formation of the base region, the mesa type etching is carried out so that the semiconductor substrate corresponding to the isolation region or stabilizing resistor region forming area is exposed. Thereafter, the emitter diffusion is carried out so that the emitter region which is shallower than any emitter region formed simultaneously in the peripheral flat area is formed in the area just under said extruded part, so that the "emitter-dip" level generated when the isolation region and stabilizing resistor region are formed in said extruded area is cancelled and compensated.

As explained in detail above, this invention discloses a transistor where the base region having a first conductivity type is formed on the collector having the opposite conductivity type, and the emitter region having the opposite conductivity type is formed in said base region, having the feature that the emitter lead-out electrodes which are disposed and extended on said emitter region andd connect in parallel the isolated small emitter regions via the lead-out electrode connecting windows are capable of connecting in parallel said small emitter regions without being disposed on the base region. At this time, therefore, if pinholes exist on the insulating film and if the emitter lead-out electrodes are thereby connected to the isolation regions, a short circuit is limited only to that between said isolation regions and the adjacent small emitter regions and does not extend to between the entire emitter region and to the base region since said isolation regions are insulated and isolated from the base region via the emitter region and each is at an electrically floating condition. For this reason, there is no decline of manufacturing yield and deterioration of reliability due to the pinholes on the insulating film just under said emitter lead-out electrodes.

Furthermore, said emitter lead-out electrode can be formed over almost the entire width of the striped emitter region, increasing the effective cross section of the electrode. Thereby such structure is very effective for handling a high output power by increasing the number of transistor units formed in said striped emitter region.

Since said isolation regions can be formed by a diffusion method simultaneously with the stabilizing resistor region and/or the base contact region, the manufacturing steps are not increased.

As explained above, this invention can offer a transistor having excellent electrical characteristic without declining the manufacturing yield with fewer manufacturing steps by improving the isolation structure of each transistor unit, the structure for forming the stabilizing resistor region in each said transistor unit, the structure for leading out the emitter lead-out electrodes, and the structure for forming the base contact region.

In the above embodiment, the NPN transistor is explained as an example but this invention of course can be adapted to the PNP transistor.

In addition, the stabilizing resistor region is not limited to the shape having a constricted part as in the above embodiments since it is of course possible to have another shape having no constricted part so long as the desired resistance value can be obtained.

What is claimed is:

1. A transistor comprising,
   a collector region having a first conductivity type,
   a base region having the opposite conductivity type disposed in contact with said collector region,
   at least one emitter region having said first conductivity type formed in said base region,
   a plurality of isolation regions having said opposite conductivity type selectively formed in each said emitter region to divide each said emitter region into a respective plurality of smaller emitter regions, each said smaller emitter region forming a p-n junction with said base region over essentially the entire area of the smaller emitter region, and
   a stabilizing resistor corresponding to at least one of each said smaller emitter regions and located in the vicinity thereof, each said stabilizing resistor having a first terminal connected to the respective smaller emitter region(s) at a position over and within said area of said p-n junction.

2. The transistor of claim 1, comprising a plurality of said emitter regions arranged in parallel, each said emitter region having a corresponding plurality of said isolation regions and a corresponding plurality of said smaller emitter regions, all of said smaller emitter regions being disposed in the form of a matrix.

3. The transistor of claim 1, comprising at least one first conductive layer selectively disposed along each said emitter region and over the respective isolation regions to connect in parallel said smaller emitter regions of the respective emitter region.

4. The transistor of claim 3 comprising each said stabilizing resistor being connected between the corresponding smaller emitter region(s) and the respective first conductive layer.

5. The transistor of claim 4, each said stabilizing resistor comprising a thin film of a material that is a metallic substance or a polycrystalline semiconductor substance.

6. The transistor of claim 1, said at least one emitter region comprising a plurality of striped portions, each having a stripe configuration and all being aligned in parallel, each said striped portion corresponding to a one of said smaller emitter regions and being connected at one end to a common part of said at least one emitter region, and each said isolation region being located within a respective striped portion near said end thereof connected to said common part.

7. The transistor of claim 6, comprising a respective plurality of further ones of said isolation regions in each said striped portion to form a corresponding plurality of further ones of said smaller emitter regions in each said striped portion, each said further isolation region being aligned transversely to the respective striped portion.

8. The transistor of claim 7, each said further isolation region comprising at least two portions.

9. The transistor of claim 6 comprising additional isolation regions, each said additional isolation region extending between adjacent pairs of said further isolation regions each said additional isolation region being aligned in the direction of the respective striped portion to form a respective one of said smaller emitter regions at each side of each said additional isolation region.

10. The transistor of claim 1 comprising selected ones of said isolation regions comprising respective ones of said stabilizing resistors, each said stabilizing resistor having a first terminal that is electrically connected to at least one adjacent one of said smaller emitter regions.

11. The transistor of claim 1 or 10, comprising each said emitter region being rectangularly shaped in plan view.

12. The transistor of claim 10, comprising each said isolation region comprising one of said stabilizing resistors.

13. The transistor of claim 10 or 12 comprising,
   each said first conductive layer being connected to the other terminal of the respective stabilizing resistor of the respective smaller emitter regions(s), and
   a plurality of second conductive layers, each connecting between said first terminal of each respective stabilizing resistor and each respective one of said smaller emitter regions.

14. The transistor of claim 10 or 12 comprising each said emitter region being shaped in the form of a stripe, each of said stripes being parallel to any others.

15. The transistor of claim 14, comprising each said stabilizing resistor being disposed at approximately right angles to the direction of each said emitter stripe.

16. The transistor of claim 15, comprising each said smaller emitter region being rectangularly shaped.

17. The transistor of claim 1, 10, or 13, comprising
   a base contact region extending on each said base region along the direction of a selected plurality of said smaller emitter regions, and
   a respective third conductive layer connected to each said base contact region.

18. A transistor comprising,
   a collector region having a first conductivity type,
   a base region having the opposite conductivity type located over and in contact with said collector region, a plurality of striped emitter regions having said first conductivity type formed in said base region, a common region having said first conductivity type formed in said base region to connect to each said striped emitter region, and a plurality of isolation regions having said opposite conductivity type respectively formed in the stripped emitter regions in the vicinity of where the respective ones of said striped emitter regions connect to said common region, to essentially isolate each said striped emitter region from said common region, each said isolation region comprising a stabilizing resistor for the corresponding striped emitter region.

19. The transistor of claim 18 comprising a further isolation region formed in essentially the entire part of said common region.

20. The transistor of claim 18 comprising a further isolation region formed in said common region, at least one bonding pad formed over said further isolation region, a plurality of first conducting layers respectively extending over each said striped emitter region, each said first conducting layer being connected to one terminal of the respective stabilizing resistor, and the other terminal of each said stabilizing resistor being connected to said at least one bonding pad.

21. The transistor of claim 20 comprising a plurality of additional isolation regions of said opposite conductivity type formed in each said striped emitter region to form a plurality of smaller active emitter regions in each said striped emitter region, all of said striped emitter regions being oriented in parallel with each other, each said first conductive layer being connected in parallel to the smaller emitter regions of the respective striped emitter region, and said smaller emitter regions comprising a matrix.

22. The transistor of claim 21, comprising each said additional isolation region comprising a respective stabilizing resistor, each said stabilizing resistor being connected at a first terminal to at least one adjacent one of said smaller emitter regions, and all of said stabilizing resistors of each said striped emitter region being connected at a second terminal to the respective first conductive layer.

23. The transistor of claim 18 comprising a respective one of said isolation regions formed at the end of each said striped emitter region.

24. The transistor of claim 23 comprising one of said isolation regions at the end of each said striped emitter region adjacent to said common region, each said isolation region comprising a stabilizing resistor connected at one end to the respective emitter region.

* * * * *

UNITED STATES PATENT AND TRADEMARK OFFICE
CERTIFICATE OF CORRECTION

PATENT NO. : 4,370,670
DATED : 25 January 1983
INVENTOR(S) : Nawata et al

It is certified that error appears in the above-identified patent and that said Letters Patent is hereby corrected as shown below:

Front Page, [73] Assignee, "Kanagawa" should be --Kawasaki--.

Column 2, line 2, "let" should be --led--.

Signed and Sealed this

Tenth Day of January 1984

[SEAL]

Attest:

GERALD J. MOSSINGHOFF

Attesting Officer      Commissioner of Patents and Trademarks